Oct. 17, 1967 W. HEYWANG 3,347,719

METHOD OF PRODUCING SEMICONDUCTOR COMPONENTS

Filed Aug. 10, 1964

United States Patent Office 3,347,719

Patented Oct. 17, 1967

3,347,719

METHOD OF PRODUCING SEMICONDUCTOR COMPONENTS

Walter Heywang, Munich, Germany, assignor to Siemens & Halske Aktiengesellschaft, Berlin, Germany, a corporation of Germany Filed Aug. 10, 1964, Ser. No. 389,519
Claims priority, application Germany, Aug. 12, 1963, S 86,695
10 Claims. (Cl. 148—187)

Figure 1:
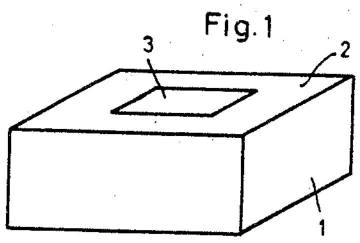

My invention relates to a method of providing semiconductor bodies for electronic and other purposes with junctions of a defined size between regions of respectively different conductance types and/or different conductivity, according to which dopant substances are diffused into the semi-conductor body with the aid of a masking technique.

Masking by means of an oxide coating has been particularly advantageous. In this method, the surface of the semiconductor body is given an oxide coating before commencing the diffusion process. When using silicon, for example, the semiconductor is subjected to oxidizing heat treatment in the presence of steam. The resulting oxide coating is then removed by etching those localities at which doping substance is to be diffused into the semiconductor body. For this purpose, the oxide coating is covered with varnish or wax which prevents the etching medium from attacking the other areas of the oxide coating. During the subsequent diffusion process, the doping substances diffuse into the semiconductor body at the exposed areas. The oxide coating serves in this method not only to control the diffusion process in entirely or partly preventing the dopant from penetrating into the semi-conductor substance underneath, but also to constitute a protective envelope which prevents the ingress of impurities from the vicinity into the semiconductor body.

This method has the disadvantage that the exposing of very small and accurately defined areas of the semiconductor surface by etching the oxide coating therefrom, is very difficult and, furthermore, that the etching media almost inevitably introduce additional impurities. In addition, impurities that fall upon the exposed areas of the semiconductor surface may cause faulty doping at these localities.

It is an object of my invention to eliminate these disadvantages in the production of semiconductor components by diffusing material into semiconductor crystals for producing on limited areas a region of a given conductance type or given conductivity.

Another, more specific object of the invention is to minimize the detrimental effect of impurities which may reach the semiconductor surface areas at permeable localities of the oxide coating, or on exposed areas not covered by the oxide coating.

Still another object of the invention is to permit performing a method of the above-mentioned type, without the use of a hydrofluoric acid etching media since such acid is usually greatly contaminated thereby causing faulty doping.

According to the invention, at least one additional substance is placed upon the oxide layer which coats the semiconductor crystal, on the areas in which the diffusion is to be performed. This additional substance is so chosen that the system addition-substance/oxide forms at the diffusion temperature a phase, preferably a glass-like or vitreous melt, permeable to the diffusion material, without exposing the semiconductor surface.

According to another feature of the invention, the system or substance combination employed forms a compound or a eutectic which melts at the diffusion temperature. A system which does not attack the semiconductor material is preferably employed. For example, when the method according to the invention is performed with a silicon crystal coated with silicon dioxide, suitable materials which form a eutectic or compound melting at the diffusion temperature and do not chemically attack the crystal are: $As_2O$, $K_2O$, $B_2O_3$, FeO, MnO, PbO.

According to a preferred embodiment of the invention, I achieve the formation of the liquid phase by employing a two-component system, such as the binary system $SiO_2/Na_2O$. However, a multi-component system, preferably a ternary system, is employed for obtaining the liquid phase. A particular advantage of ternary systems is that the temperature range in which the liquid phase occurs can be adjusted with great accuracy.

According to another embodiment of my invention, the semiconductor surface of the crystal is coated by anodic or thermal oxidation with a layer consisting of an oxide of the semiconductor material. For example, silicon is coated in this manner with $SiO_2$. According to another embodiment, the semiconductor surface is coated with an adhesive layer of an extraneous oxide. For example, germanium can be coated with $SiO_2$. Such a coating can be produced for example by a vapor-deposition technique.

The addition substance may consist of a material which has no doping action. The addition material, however, as many simultaneously act as a dopant, e.g. when using $B_2O_3$ as addition substance in conjunction with silicon or germanium coated with $SiO_2$. The addition substance may produce recombination centers in the semiconductor material, as is the case with MnO, or FeO when used in conjunction with a semiconductor crystal coated with $SiO_2$. The addition material may have a gettering effect for the heavy-metal ions acting as recombination centers. PbO is such an addition material.

Oxides are particularly well suitable as addition substances. Thus, oxides of elements from the group of the alkali metals, for example $Na_2O$, $K_2O$, are applicable. Oxides of heavy metals such as MnO, FeO are also applicable. Further, oxides from the third group of the periodic system, such as the above-mentioned $B_2O_3$, are suitable. Alkali-earth oxides such as CaO, SrO, BaO and MgO are particularly favorable when employing a ternary system, such as the use of CaO in the ternary system $SiO_2/CaO/Na_2O$.

Aside from the oxides, a number of non-oxidic addition substances are applicable for producing the liquid phase. Among these are mainly alkali halides, particularly fluorides, which react with the oxide to form a compound melting at the diffusion temperature. An example of such a substance is $Na_2F_2$.

As mentioned, the addition substance is deposited upon selected areas of the oxide-coated semiconductor crystals. One mode is to apply a vapor-deposition method. This method is preferably employed together with a masking technique so that the addition substance is vapor-deposited only upon the localities of the oxide coating where the diffusion materials are to be subsequently diffused into the crystal. Another way of applying the addition substances is to use them in dissolved form and to brush or spray them onto the oxide areas at which the diffusion materials are to be subsequently applied. Still another way is to deposit the diffusion material simultaneously with the addition substance upon the oxide coating of the semiconductor crystal. According to another mode of performing the method of the invention, the diffusion material is deposited in a separate operation, after the addition substance is placed upon the oxide-coated semiconductor surface.

Upon termination of the diffusion process, the permeable layer can be removed with the aid of a suitable solvent, preferably water.

A particular advantage of the invention is that any impurities that may drop upon the permeable localities of the oxide coating become uniformly distributed over the entire permeable area because the permeable layer consists of a glassy melt. As a result, a high faulty doping concentration at the localities where impurities reach the surface, is prevented. Products that are formed from the melt at the diffusion temperature, have the further advantage that most of them can be dissolved without the use of hydrofluoric acid, which often is greatly contaminated.

Figure 2:
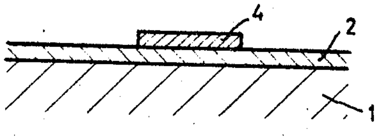
Figure 3:
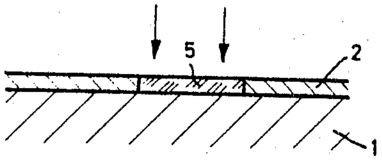
Figure 4:
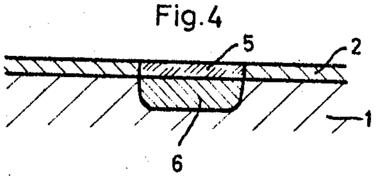

Another advantage is the fact that it is considerably simpler to perform a vapor deposition upon very small, limited and well defined areas than it is to expose such areas by etching. Likewise, such small areas can more easily be excluded from vapor deposition than from an etching process. The invention will be further described with reference to the accompanying drawings in which:

FIG. 1 shows schematically and in perspective a semiconductor crystalline body to be processed according to the invention; and FIGS. 2, 3 and 4 show in cross section a portion of the same body during respectively different stages of the process.

FIG. 1 shows a semiconductor crystal 1 coated with a layer 2 of oxide. The crystal for example consists of silicon and the coating of silicon dioxide. The oxide coating has a limited area 3, which is permeable to diffusion materials. The size of this area can be accurately fixed and preserved by virtue of the method according to the invention.

This region 3 is produced in the manner indicated in FIGS. 2 and 3. After the oxide coating 2 is produced on the semiconductor crystal 1, an addition substance 4 is deposited upon the area where the coating is to become permeable to the diffusion material. When the body is subjected to the diffusion temperature, the presence of the addition substance 4 has the effect that in the region of area 3 a liquid phase 5, shown in FIG. 3, is formed. This phase is permeable to the diffusion materials.

When the diffusion process is thereafter performed in the conventional manner, the diffusion materials, for example dopant substance, permeates through the region 5 and forms a doped region 6 in the semiconductor crystal 1, as shown in FIG. 4.

In the following example, the liquid phase is produced with the aid of a binary system comprising an addition substance which does not effect doping of the semiconductor material. A semiconductor body consisting of monocrystalline n-type silicon is coated with $SiO_2$ by thermal oxidation. The thickness of the oxide coating is approximately 1$\mu$. Thereafter a layer of $Na_2O$ of approximately 0.25$\mu$ thickness is vaporized onto the areas at which the semiconductor material is to be subsequently doped by diffusion. The amount of the sodium oxide employed for this purpose depends upon the quantity of the silicon dioxide to be dissolved as well as upon the temperature at which the subsequent diffusion is to be performed. This quantity can be determined with the aid of the available phase diagrams of the system $Na_2O$-$SiO_2$. The lowest eutectic of this binary system is at 800° C. and at 75% $SiO_2$.

When $K_2O$ is used in lieu of $Na_2O$, the quantity of the vapor-deposited addition is to be chosen accordingly. The lowest-melting eutectic of this system is at 750° C. and 68% $SiO_2$. $Cs_2O$ and $Rb_2O$ may also be used in lieu of $Na_2O$.

When oxides of the earth-alkali metals, such as CaO, are used as addition substances, the very high eutectic temperatures of the systems alkali-earth metal oxide-$SiO_2$ make necessary another addition. Suitable for such other addition are, for example, the oxides of the alkali metals, e.g. $Na_2O$. The use of such ternary systems has the advantage of many possible variations. One of the applicable systems is the above-mentioned ternary system $SiO_2$/CaO/$Na_2O$.

The following example relates to a process in which the addition substance simultaneously serves as a dopant. A semiconductor body consisting of n-type silicon is coated with an $SiO_2$ layer of approximately 1$\mu$ thickness in the above-described manner. Thereafter a layer of $B_2O_3$ is vapor-deposited having a thickness of approximately 0.1$\mu$. The deposition of the boron oxide is limited to the area that is to be doped. Subsequently the body is subjected to a diffusion temperature of approximately 1000° C. This results in the formation of a melt. The boron serves simultaneously as a doping substance and penetrates into the semiconductor body. The depth of penetration is determined by the duration of the diffusion process and the quantity of boron employed. Illustrative of other suitable oxide dopants are $In_2O_3$, $Al_2O_3$, $Sb_2O_3$ and $P_2O_5$.

According to a further example, the addition substance is so chosen as to be simultaneously suitable for producing recombination centers in the semiconductor body. Suitable addition substances of this kind are particularly FeO, NiO and MnO. The system FeO-$SiO_2$ has an eutectic melting at 1180° C. and composed of 62% FeO and 38% $SiO_2$. The eutectic temperature of the system MnO-$SiO_2$ is 1200° C. The eutectic composition contains 37% $SiO_2$ and 63% MnO.

According to a further example, the addition substance consists of PbO which serves for gettering any heavy-metal ions that may be contained in the semiconductor body. The quantity of the BbO employed depends upon the diffusion temperature and can be determined from the phase diagram of the system $SiO_2$/PbO. BaO may be used in the same manner as PbO.

According to a further example, the semiconductor body, preferably a silicon crystal, is coated with a layer of $SiO_2$ and, in lieu of an oxide, the salt $Na_2F_2$ is vapor-deposited upon the above-mentioned selected area of the $SiO_2$ coating. The body is thereafter heated in an oxidizing atmosphere, preferably air. A liquid phase is then formed consisting of a fluorosilicate-type compound. An advantage of this method resides particularly in the low melting temperature of the evolving compound.

If desired, the method can be repeated two or more times. In this case, the permeable layer can be removed between the individual diffusion steps. However, it may also be preserved and the semiconductor region beneath the permeable layer can then be oxidized to a further extent. The method is particularly well suited for the production of semiconductor components of silicon, but is also applicable to germanium or semiconductor bodies consisting of compounds such as $A^{III}B^{V}$ or $A^{II}B^{VI}$ semiconductor compounds.

If the semiconductor material consists of germanium, an $A^{III}B^{V}$ compound such as gallium phosphide, gallium-antimonide, indium arsenide and indium phosphide, or an $A^{II}B^{VI}$ compound such as zinc-sulfide and cadmium-sulfide, it is necessary to provide the semiconductor crystal with an oxide coating of a different element. It has been found favorable to vaporize SiO onto the semiconductor surface. The SiO itself is then employed as a mask or it is subjected to heat treatment in an oxidizing atmosphere in order to be further oxidized to $SiO_2$. In the selection of the systems to be employed for the formation of the liquid phase, the diffusion temperatures for diffusion materials are lower for germanium or the semiconductor compounds than for silicon, which should be taken into consideration. For example, the diffusion temperatures for germinaum are in the range of 600 to 900° C.; and for gallium arsenide in the range of 800 to 900° C.

I claim:

1. A method for producing semiconductor components having limited regions of respectively different conductances produced by diffusing doping material into the oxide-coated semiconductor crystals, which comprises depositing, in the areas that are to be subsequently subjected to diffusion, at least one additional substance upon the oxide coating of the semiconductor crystal so that the addition substance forms with the oxide coating a system which forms at the diffusion temperature a phase permeable to the diffusion material, preferably a vitreous melt, without exposing the semiconductor surface, heating the coated semiconductor surface to produce said vitreous melt, and diffusing doping substance through the melt at diffusion temperature into said semiconductor crystal.

2. A method for producing semiconductor components having limited regions of respectively different conductances produced by diffusing doping material into the oxide-coated semiconductor crystals, which comprises depositing, in the areas that are to be subsequently subjected to diffusion, at least one additional substance upon the oxide coating of the semiconductor crystal so that the addition substance forms with the oxide coating a system which forms a eutectic melting at the diffusion temperature, heating the coated semiconductor surface to produce said eutectic, and diffusing doping substance through the eutectic at diffusion temperature into said semiconductor crystal.

3. A method for producing semiconductor components having limited regions of respectively different conductances produced by diffusing doping material into the oxide-coated semiconductor crystals, which comprises depositing, in the areas that are to be subsequently subjected to diffusion, at least one additional substance upon the oxide coating of the semiconductor crystal so that the addition substance forms with the oxide coating the binary system $SiO_2/Na_2O$, heating the coated semiconductor surface to produce said binary system, and diffusing doping substance through the binary system at diffusion temperature into said semiconductor crystal.

4. The method of claim 1, wherein $B_2O_3$ is deposited in the areas that are to be subsequently subjected to diffusion.

5. The method of claim 1, wherein MnO is deposited in the areas that are to be subsequently subjected to diffusion.

6. The method of claim 1, wherein $Na_2F_2$ is deposited in the areas that are to be subsequently subjected to diffusion.

7. The method of claim 1, wherein CaO and $Na_2O$ are deposited to form the system $SiO_2/CaO/Na_2O$ which at the diffusion temperature is permeable to the diffusion material, without exposing the semiconductor surface.

8. The process of claim 1, wherein the addition substance is deposited by vaporization through a mask upon the areas of the oxide coating where the diffusion of the diffusion-doping material is to be subsequently effected.

9. The method of claim 3, wherein $B_2O_3$ is applied simultaneously with $Na_2O$.

10. The method of claim 1, wherein PbO is deposited in the areas that are to be subsequently subjected to diffusion.

References Cited

UNITED STATES PATENTS

| | | | |
|---|---|---|---|
| 2,823,149 | 2/1958 | Robinson | 148—187 |
| 3,156,593 | 11/1964 | Ligenza | 148—187 |
| 3,200,019 | 11/1965 | Scott et al. | 148—187 X |
| 3,210,225 | 10/1965 | Brixey | 148—187 |

HYLAND BIZOT, *Primary Examiner.*